United States Patent [19]

Ploog et al.

[11] Patent Number: 4,775,881
[45] Date of Patent: Oct. 4, 1988

[54] SEMICONDUCTOR DEVICE FOR DETECTING ELECTROMAGNETIC RADIATION OR PARTICLES

[75] Inventors: Klaus Ploog; Yoshiji Horikoshi, both of Stuttgart, Fed. Rep. of Germany

[73] Assignee: Max-Planck-Gesellschaft zur Forderung der Wissenschaften e.V., Fed. Rep. of Germany

[21] Appl. No.: 14,197

[22] Filed: Feb. 13, 1987

Related U.S. Application Data

[63] Continuation of Ser. No. 737,628, Jun. 22, 1985, abandoned.

[30] Foreign Application Priority Data

May 30, 1984 [EP] European Pat. Off. ........ 84106242.5

[51] Int. Cl.[4] ............................................. H01L 31/10
[52] U.S. Cl. .......................................... 357/30; 357/4; 357/20; 357/89
[58] Field of Search .................. 357/13, 14, 4, 30, 20, 357/89

[56] References Cited

U.S. PATENT DOCUMENTS

| | | | |
|---|---|---|---|
| 3,882,533 | 5/1975 | Doehler | 357/58 |
| 3,994,012 | 11/1976 | Warner, Jr. | 357/20 |
| 4,371,406 | 2/1983 | Li | 148/171 |
| 4,471,367 | 9/1984 | Chen et al. | 357/22 A |
| 4,476,477 | 10/1984 | Capasso et al. | 357/30 A |

FOREIGN PATENT DOCUMENTS 2089119 6/1982 United Kingdom .................. 357/13

OTHER PUBLICATIONS

Kaneda et al., 1977 IEEE IEDM, Digest of Technical Papers, pp. 107–110 (Dec. 1977).
IBM Technical Disclosure Bulletin vol. 22, No. 3, Aug. 1979, pp. 1262–1264 (Esaki et al.).
Heterostructure & Superlattice Devices, Tokyo, Feb. 6-7, 1984, Doehler, "Future nipi Devices".
Optical Fiber Telecommunications—"Photodetectors" by Tien Pei Lee and Tingye Li (1979), pp. 593–626.

Primary Examiner—William D. Larkins
Attorney, Agent, or Firm—Townsend & Townsend

[57] ABSTRACT

A semiconductor device of the doping superlattice type for detecting electromagnetic radiation or particles comprises a semi-insulating substrate (10), a first layer (11) of either n-type or p-type conductivity deposited thereon, a plurality of layers (12, 13, 14) of alternating conductivity types deposited in series on said first layer (11), a strongly p-type electrode region which extends through said p-type and n-type layers (11, 12, 13, 14) and defines a first selective electrode (15), and a strongly n-type electrode region which also extends through said p-type and n-type layers (11, 12, 13, 14), and which is spaced apart from said strongly p-type region and defines a second selective electrode. The device is a homogeneous semiconductor in which the n-type and p-type layers other than the first layer (11) and the outermost layer (14) have substantially identical thicknesses and doping concentrations. The first layer (11) and the outermost layer (14) are of the same conductivity type and have a thickness substantially equal to one half of the thickness of each of the other layers (12, 13). Furthermore, the first layer and the outermost layer have a doping concentration substantially identical to the doping concentration of the other layers. This makes it possible to completely deplete the entire structure thus a high reverse bias can be applied to the device thereby tilting the resultant electric field with respect to the layers. A device of this kind is particularly suited for use as an optical detector in the infrared wavelength region around 1 $\mu$m and longer. The device has low dark current at room temperature, a very small capacitance and therefore a fast response time.

8 Claims, 12 Drawing Sheets

SEMICONDUCTOR DEVICE FOR DETECTING ELECTROMAGNETIC RADIATION OR PARTICLES

This is a continuation of application Ser. No. 737,628, filed June 22, 1985, now abandoned.

The present invention relates to a semiconductor device for detecting electromagnetic radiation or particles, the device comprising a semi-insulating substrate, a first layer of either n-type or p-type conductivity deposited thereon, a plurality of layers of alternating conductivity types deposited in series on said first layer, a strongly p-type electrode region which extends through said p-type and n-type layers and defines a first selective electrode, and a strongly n-type electrode region which also extends through said p-type and n-type layers, and which is spaced apart from said strongly p-type region and defines a second selective electrode.

Semiconductor devices of this kind, often referred to as doping superlattices, are known from German patent specification No. 22 61 527.

It is known that these semiconductor devices have unusual electrical and optical characteristics.

The object underlying the present invention is to provide an improved semiconductor device which is suitable for detecting radiation, in particular radiation with energies less than the bulk semiconductor band gap energy ($e_g^o$) in the host material, and which is also suitable for detecting particles with equivalent energies, with the device preferably having a relatively low capacitance and a relatively low dark current at room temperature.

In order to satisfy this object there is provided, in accordance with the invention, a device of the initially named kind which is characterised in that the device is a homogeneous semiconductor in which the n-type and p-type layers other than the first layer and the outermost layer have substantially identical thicknesses and doping concentrations; in that the first layer and the outermost layer are of the same conductivity type and have a thickness substantially equal to one half of the thickness of each of the other layers; in that the first layer and the outermost layer have a doping concentration substantially identical to the doping concentration of the other layers; and in that the total number of layers of alternating conductivity is an odd number; whereby a high reverse bias can be applied to the device, thereby tilting the resultant electric field with respect to the layers.

It has been found that semiconductor devices characterised as above are extremely sensitive to infrared radiation, exhibit a low dark current at room temperature and have very low capacitance and therefore fast response.

These devices, which are formed by periodic alternate doping with n- and p-type impurities in an otherwise homogeneous material, have been grown by molecular beam epitaxy (MBE). The space charge induced periodic modulation of the energy bands in these doping superlattices leads to a confinement of electrons and holes in alternate layers ("indirect gap in real space") and to an effective energy gap that can be tailored between zero and the bulk semiconductor band gap energy $E_g^o$ in the host material by appropriate choice of the doping concentrations ($N_d$, $N_a$) and thicknesses ($d_n$, $d_p$) of the constituent layers. Due to the effective spatial separation recombination of excess carriers is strongly reduced, and large deviations of electron and hole concentrations from thermal equilibrium become quasi-stable. This non-equilibrium excited state is characterised by separate quasi-Fermi levels $E_{fn}$ for electrons and $E_{fp}$ for holes. The charge of mobile excess carriers, however, partly compensates the bare impurity space-charge potential resulting in a reduction of the original potential amplitude $V_o$. Consequently, the free carrier concentration as well as the effective energy gap are no longer constant material parameters in a given doping superlattice, but they are tunable by external carrier injection or extraction.

The internal space-charge fields in doping superlattices result in a strong exponential tail of the absorption coefficient $\alpha$ ($\omega$) at photoenergies below $E_g^o$ (Franz-Keldysh effect). The absorption of photons with energy $E_g^{eff} < \hbar\omega < E_g^o$ is thus possible. In addition, the absorption coefficient is tunable, since for a given photon energy the overlap between initial and final states changes with variation of the effective gap (or quasi-Fermi level difference $E_{fn} - E_{fp}$). These peculiarities make doping superlattices very attractive for application in optical detectors covering a large energy range.

In general, the constituent superlattice layers are not completely depleted at zero bias and the undepleted central portions of the n-type and p-type layers are at the same potential as the selective n- and p-type electrodes.

In one development of the invention the semiconductor device is characterised by its combination with circuit means for applying a high reverse bias across the selective electrodes.

This embodiment allows the energy sensitivity to be selected. For some applications, the reverse bias is preferably selected to be so high that the capacitance of the device is determined only by the electrode geometry. In this case the capacitance of the device becomes very low and its speed of response is accordingly high. Furthermore the device can be caused to avalanche thus enhancing the signal.

In a further embodiment means is provided for varying the reverse bias which enables the energy sensitivity of the device to be tuned.

When the reverse bias is applied between the n-type and p-type layers via the selective electrodes electrons and holes are extracted from the central portions of the respective layers and the amplitude of the space charge potential increases. If the reverse bias is further increased, the n-type and p-type layers of the superlattice are finally totally depleted at a certain threshold voltage and the corresponding potential wells for carrier confinement have reached their maximum depths. At this point, the strongly enhanced internal space-charge fields make possible the absorption of extremely long wavelength radiation through the Franz-Keldysh effect. Further increase of the reverse bias only adds a constant electric field parallel to the length of the layers (i.e. the potential is tilted in the layer direction), and the photogenerated electrons and holes are more efficiently swept out into the selective electrodes to be detected by photoconductive response.

In the above described semiconductor devices the total number of layers of alternating conductivity types is typically an odd number lying between 9 and 51 and preferably amounting to 21, the device should have a minimum total thickness of one micron.

By increasing the number of layers one obtains increased sensitivity, the effort required to produce a very large numbers of layers is however not inconsiderable so that a trade off has to made between sensitivity and effort/cost.

In a particularly preferred embodiment the n-type and p-type material is GaAs with suitable dopants, and the cladding layers, comprising the first layer and the outermost layer are of n-type conductivity.

Gallium arsenide has the particular advantage that it does not suffer radiation damage and is thus suitable, amongst other things, for applications in outer space. Furthermore, it is found that the use of n-type conductivity material for the cladding layers results in an extremely low dark current at room temperature. Such GaAs devices are able to detect infrared radiation up to at least 2 $\mu$m wavelengths.

In an alternative embodiment the n-type and p-type material is silicon with suitable dopants. A device of this kind has an extended wavelength or sensitivity range and the significant advantage that common surface passivation techniques can be used to avoid problems with surface leakage currents.

As a further alternative the n-type and p-type material is indium gallium arsenide with suitable dopants. With this arrangement the bulk semiconductor band gap $E_g^o$ is lower so that detection of IR radiation up to at least 4 $\mu$m should be possible.

Of course, basically any semiconductor material can be used to realise a semiconductor device in accordance with the present invention.

In a further development of the invention layers of intrinsic material are provided between the alternate layers of different conductivity types as known per se from German patent specification No. 22 61 527, however, the arrangement of the invention is characterised in that the intrinsic material is not provided outside of the cladding layers.

At high doping concentrations, which are of particular interest in semiconductor devices of the presently proposed kind, the tunnelling effect can be kept low by the intrinsic material resulting in low dark current but a high density of states in the forbidden gap. The intrinsic material is conveniently made circa 100 Å thick.

The invention will now be described in more detail by way of example only and with reference to the accompanying drawings which show:

FIG. 1 a schematic cross-section of a semiconductor device in accordance with the invention, FIG. 2 a schematic representation of the band shape of the semiconductor device of FIG. 1 with an applied reverse bias, FIG. 3 the band structure of the semiconductor device of FIG. 1 with the modulation resulting from the inherent space charge, FIGS. 4a to 4c a schematic band structure of a device similar to FIG. 1 in which the doping superlattice layers are completely depleted before biasing, i.e. $N_d \cdot d_n = N_a \cdot d_p$ (symmetric structure) and $V_M \leq E_{fn} - E_{fp}$, in which:

FIGS. 5a to 5c a schematic band structure of a device similar to FIG. 1 in which the doping superlattice layers are not completely depleted before biasing, i.e. $N_d \cdot d_n = N_a \cdot d_p$ (symmetric structure) and $V_M > E_{fn} - E_{fp}$, in which:

FIG. 5c shows the band structure when $V_R > V_{th}$, FIGS. 6a and 6b a schematic band structure for a device similar to FIG. 1 but in which the doping density in the individual layers is not the same so that the device is asymmetric i.e. $N_d \cdot d_n \neq N_a \cdot d_p (V_M > E_{fn} - E_{fp})$, with:

FIG. 6a showing the situation when the applied reverse bias $V_R \approx$ the threshold voltage $V_{th}$ at which the space charge reaches its maximum voltage, and with :

FIG. 6b showing the situation when $V_R > V_{th}$ and the difference $V_R - V_{th}$ is applied to the junction between the p+ selective electrode and the superlattice giving a tilting field at this junction, FIG. 7 the maximum space charge field as a function of the doping concentration in a symmetrically doped superlattice device as in FIG. 1, with thin straight lines representing different layer thicknesses, the dashed line representing the zero bias limit, and the solid curves showing the equi-tunnelling current density curves, FIG. 8 V - I traces measured through n—n (curve a) and p—p (curve b) selective contacts for a doping superlattice where $N_d \cdot d_n > N_a \cdot d_p$ in accordance with the present invention, FIGS. 9a and 9b experimental voltage characteristics for a doping superlattice detector in which $N_d \cdot d_n > N_a \cdot d_p$ and $V_M > E_{fn} - E_{fp}$ (FIG. 9a) and the contact configuration (FIG. 9b) for the detector, FIG. 10a the dependence of the spectral response on the applied bias for a specific embodiment of a semiconductor device in accordance with the present invention.

FIG. 10b the dark current characteristic for the device of FIG. 10a,

Figure 1:
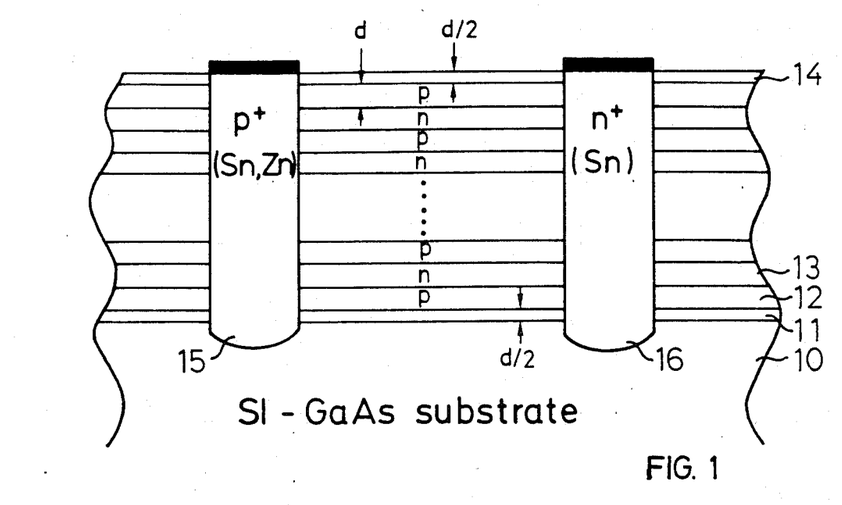

Turning first to FIG. 1 there is shown a semiconductor device having a plurality of alternate n-type and p-type layers grown at a rate of about 3 Å/sec on a non-doped semi-insulating gallium arsenide substrate 10 with (100) surface at 600° C. by molecular beam epitaxy. The layer structure comprises a first layer 11 of n-type material of 250 Å thickness which is deposited on the gallium arsenide substrate. This first layer 11 is then followed by a second layer 12 of p-type material with a thickness of 500 Å I.e. the first layer 11 has a layer thickness substantially equal to one half that of the second layer 12. The second layer 12 is followed by a third layer of n-type material of the same thickness as the second layer 12. The structure then repeats itself so that the device can be said to comprise a plurality of layers of alternating conductivity types deposited in series on the first layer. The outermost active layer 14 is of n-type material and again has a thickness substantially equal to one half the thickness of the intervening layers 12, 13.

The concentrations of donors and acceptors ($N_d$, $N_a$ respectively) are the same in all layers so that the value, given by the product of the doping concentration and the layer thickness, is the same for all intermediate layers and one half of this value for the cladding layers defined by the first layer 11 and the outermost layer 14. In this example the doping concentration is chosen to be $5 \times 10^{17}/cm^3$ with silicon and beryllium being used for the n- and p-type impurities respectively. The total doping superlattice thickness was chosen to be 2 μm, i.e. the device has a total of 21 layers. The semiconductor device has two selective electrodes, namely a strongly p-type electrode region which extends through the p-type and n-type layers and consists of an alloy of tin and zinc so that the electrode 15 gives selective contact to the p-type material. The second electrode 16 is of tin alone and gives selective contact to the n-type material. The electrode regions 15 and 16 may be made in the usual way by diffusion techniques. The semiconductor device is also provided in the usual way with a mask which prevents incident radiation falling directly on the selective electrode regions and also a surface treatment to reduce surface leakage currents.

It is important that the value calculated for each layer of the respective doping concentration times the respective layer thickness is substantially constant and it is preferable for the variation in the respective values for the individual layers not to exceed 0.5%.

The device described above is characterised by a sufficiently high sensitivity even at energies far below $E_g$ which is attributed to the Franz-Keldysh effect.

Having described the basic structure in some detail the theoretical background will now be explained.

In operation a reverse bias is applied to all the p-n junctions in the doping superlattice via the selective electrodes 15, 16. This reverse bias leads to complete depletion of both p-and n-type layers at a certain threshold voltage $V_{th}$ if the respective product values for the intervening layers, i.e. the values calculated for each layer of the respective doping concentration times the respective layer thickness, are exactly equal (and equal to twice the value in the cladding layers). At $V_{th}$ the internal field established by the periodic space charge reaches its maximum value and no more band modulation is expected for voltages exceeding $V_{th}$. Instead a further increase of the reverse voltage tilts the whole doping superlattice structure along the layers. This tilting field not only enhances the Franz-Keldysh effect, but also sweeps away the photoexcited carriers from the two dimensional subband systems very quickly. Because of the latter effect high speed of response is expected, and, moreover, the ground state is kept almost empty during excitation.

Figure 2:
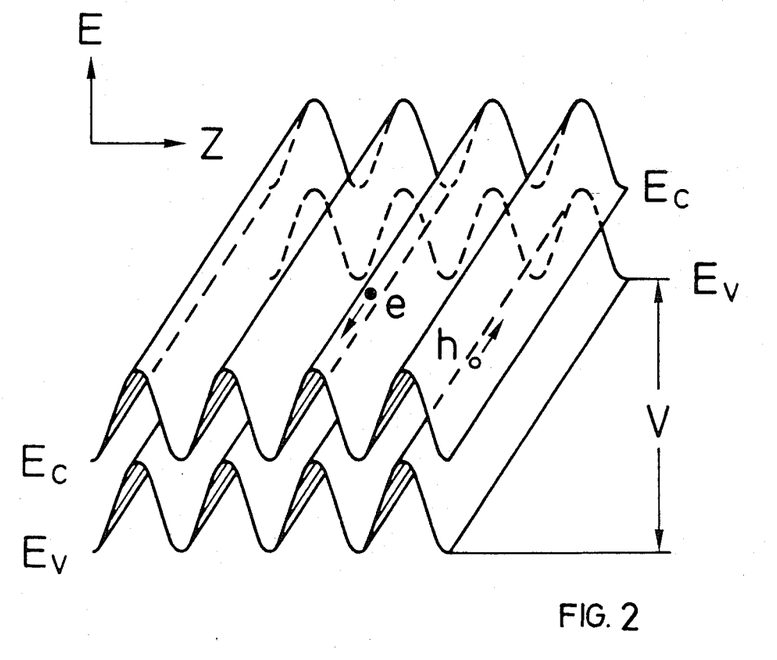

In order to apply the tilting field along the layers complete depletion should be achieved for both n-type and p-type layers. It is for this reason that it is important to hold the respective product values for the individual layers constant (and equal to twice the value in the cladding layers), i.e. the respective product values $N_d d_n = N_a d_p$ which produces a symmetric doping superlattice. A schematic band structure for the semiconductor device with applied bias is shown in FIG. 2. In FIG. 2 $E_v$ shows the shape of the valence band, $E_c$ the shape of the conductance band, the deflected regions at the two ends of the sketch are due to the selective electrode regions 15 and 16 respectively.

Figure 3:
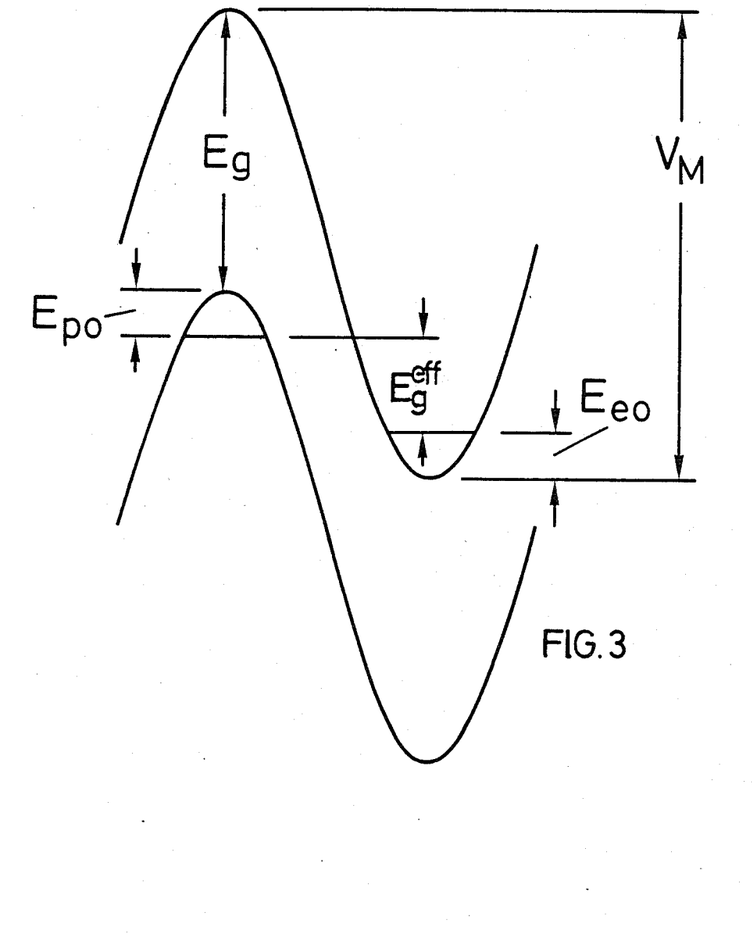

In the doping superlattices, the energy bands are spatially modulated by the ionised donors and acceptors in the constituent layers. The band modulation is schematically shown in FIG. 3, where $V_M$ represents the modulation depth of the bands, $E_{eo}$ and $E_{po}$ represent the lowest quantised electron and hole states caused by the parabolic band modulation, $E_g$ equals the bulk semiconductor band gap and $E_g^{eff} = (E_g + E_{eo} + E_{po} - q \cdot V_M)$ corresponds to the effective band gap energy of the doping superlattice. When the layers are completely depleted the band modulation depth $V_M$ is given by $$V_M = \frac{qN_d}{4E_s} \qquad \text{equation A}$$

where
q equals the elementary charge
N equals the doping concentration of the intervening layers,
d equals the layer thickness, and
$\epsilon_s$ equals the dielectric constant of the semiconductor material.

For symmetric doping superlattices with $V_M = E_{fn} - E_{fp}$, where $E_{fn}$ and $E_{fp}$ denote the Fermi levels in n-type and p-type layers respectively (when they are homogeneous), the doping superlattice layers are completely depleted before biasing, whereas, when $V_m > E_{fn} - E_{fp}$ an application of reverse bias is required for complete depletion.

Figure 4A:
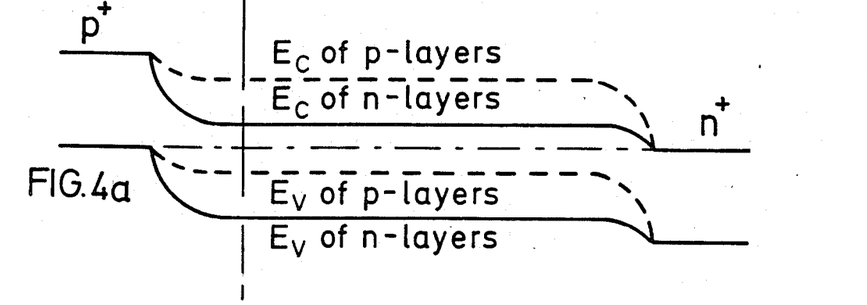
FIG. 4a shows the band structure along the layer at the centre of each layer at zero bias.
Figure 4B:
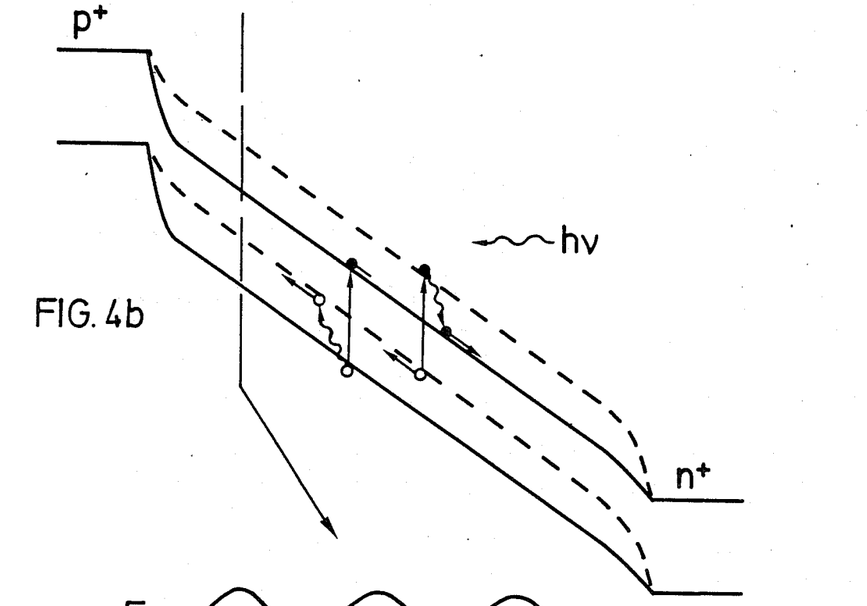
FIG. 4b shows the band structure with applied reverse bias.
Figure 4C:
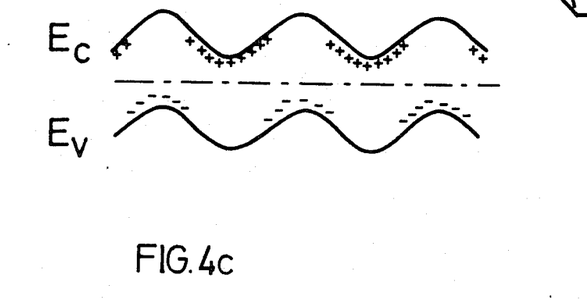
FIG. 4c shows the band structure perpendicular to the layers.

FIG. 4 shows a schematic band structure of a device similar to FIG. 1 and its doping layers are completely depleted before biasing. At zero bias, both the conduction and valence band edges should be flat along the layers except for the areas close to the selective electrodes, i.e. the p+ and n+ contact regions, as shown in FIG. 4a. Because of the complete depletion of the layers, the superlattice will be highly resistive and practically act as a semi-insulator. Thus, an externally applied reverse bias tilts the whole structure as shown in FIG. 4b. The photoexcited electrons and holes are immediately separated from each other spatially due to the strong space charge field, and then swept away by the tilting field to the respective electrode. Therefore the recombination between the photoexcited carriers is negligibly small, which results in an extremely high efficiency. Since the relaxation time for the photoexcited carriers to thermalise in the lowest conduction and valence subband systems is probably as short as $10^{-12}$ sec, the device speed is mainly dominated by the carrier sweepaway time along the parabolic well channel. FIG. 4c shows the band structure for a vertical section. The space charge field should be kept constant with varying bias because all the donors and acceptors have already been ionised at zero bias.

Figure 5A:
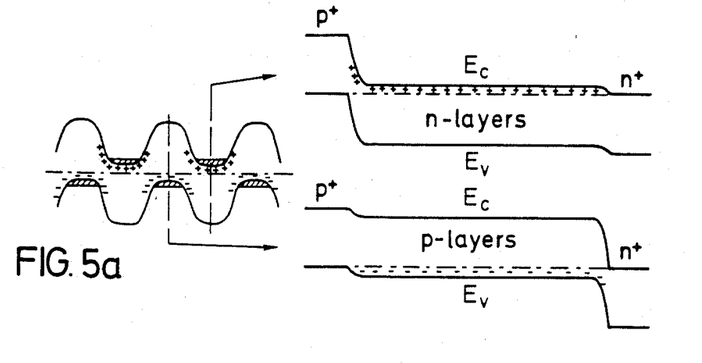
FIG. 5a shows the band structure along and perpendicular to the layers at zero bias (two dimensional subbands are ignored in this figure)
Figure 5B:
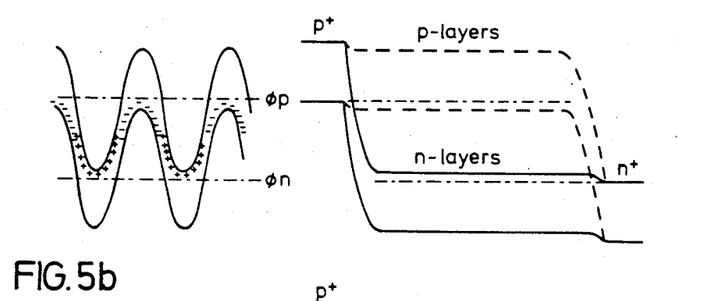
FIG. 5b shows the band structure along and perpendicular to the layers with an applied reverse bias $V_R$ equal to the threshold value $V_{th}$, i.e. with all the layers depleted.

When $V_M > E_{fn} - E_{fp}$, both n- and p-type layers of the superlattice still have free carriers in the respective band at zero bias as shown in FIG. 5a. At zero bias, the amplitude of the space charge potential is much smaller than $V_M$. When increasing the reverse bias voltage, the free electrons and holes are extracted from the central portion of the respective layer, and the space charge potential increases until all the layers are completely depleted at $V_{th}$. At this stage, the space charge potential reaches its maximum value $V_M$. This situation is depicted in FIG. 5b. Increasing the reverse bias voltage beyond $V_{th}$ tilts the whole doping superlattice and again enhances the internal electric field as shown in FIG. 5c.

Figure 5C:
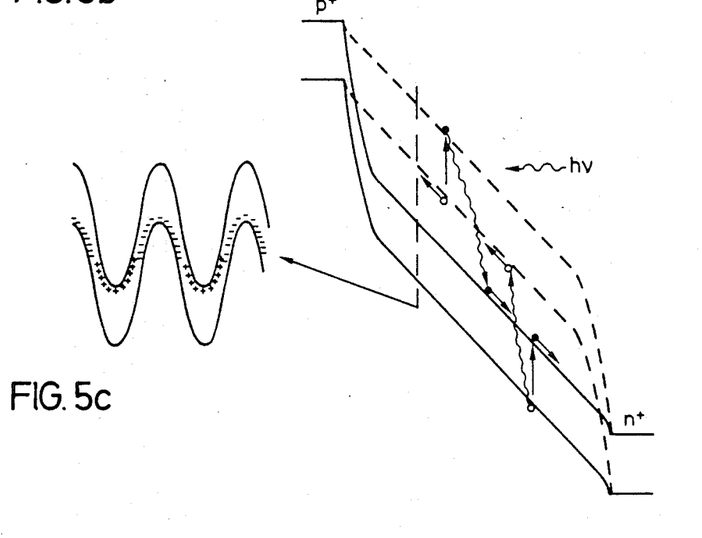
Figure 6A:
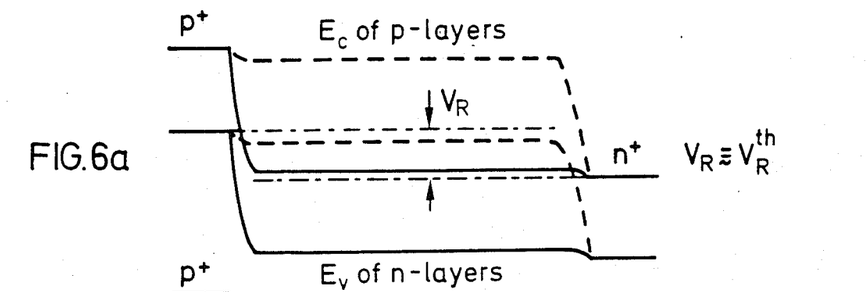
Figure 6B:
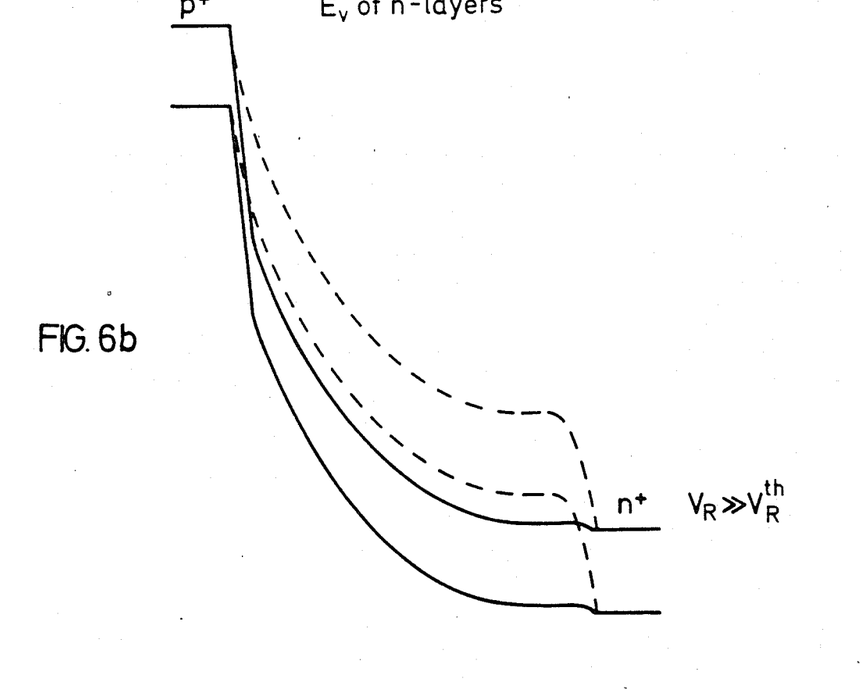

In the detector structures shown in FIGS. 4 and 5 the doping superlattices were assumed to be perfectly symmetric, i.e. with all layers having equal doping concentrations and layer thicknesses (except for the cladding layers). However, although it is very difficult to grow the alternating n-type and p-type layers with exactly equal doping concentrations and layer thicknesses. It is important to stay within the 0.5% variation limit specified above. FIG. 6 shows what happens if this criterion is not observed. If the product value $N_d d_n$ for the n-type material is greater than the product value $N_a d_p$ for the p-type material then the increase of space charge potential with reverse bias will continue until the p-type layers are completely depleted. A schematic band structure representing this situation is shown in FIG. 6a. No more band modulation can be achieved for further increase of the reverse bias and an incremental voltage will be applied to the p+-n junction formed between the p+ selective electrode region and the n-type material of the superlattice as shown in FIG. 6b, since such superlattices show n-type conductivity regardless of the bias, and cannot be highly resistive. When the residual electron concentration averaged over the layers is very large, for example, greater than $10^{17}/cm^3$ the depletion width at the aforementioned p+-n junction and therefore the width of the photosensitive region is only about 1 μm. However, if this residual electron concentration is reduced to $10^{15}/cm^3$ the photosensitive width can be extended to more than 50 μm. In the present device, a high internal electric field is particularly preferred in order to enhance the Franz-Keldysh effect below $E_g$. Indeed, the total field given by equation C (below) could be very high and an avalanche multiplication could be induced. However, an avalanche effect does not deteriorate the performance of superlattice devices in accordance with the present teaching.

Internal electric field in the doping superlattice layers enhances the tunnel-assisted photo-transition between spatially separated electron and hole subbands which leads to a considerable increase in the sensitivity at energies below $E_g$. As discussed previously, all the constituent layers should be completely depleted at operating condition. Therefore, the electric field due to the space charge is expressed by $$F_o(x) = \frac{q}{\epsilon} Nx, \quad (0 \leq x \leq d/2) \tag{B}$$

where:
x represents the distance measured from the center of the layer
N is the doping concentration (Nd=Na)
q represents the elementary charge
$\epsilon$ represents the dielectric constant in the superlattice material.

Figure 7:
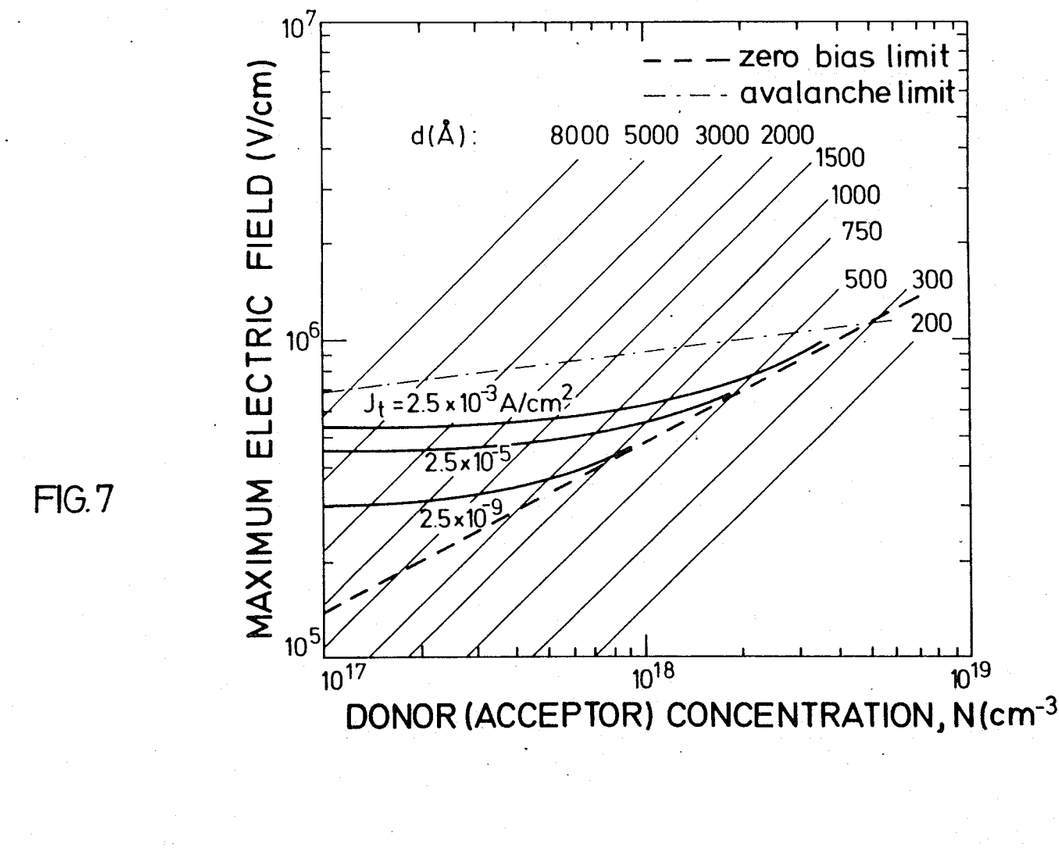

This expression reaches the maximum value $F_M = qNd/2\epsilon$, at the p-n junction. The straight lines in FIG. 7 show $F_M$ as a function of doping concentration for various layer thicknesses. The dashed line represents the zero bias limit for complete depletion. The doping superlattice structures below this line are completely depleted without bias, while those above this line require appropriate reverse biases for complete depletion. This figure suggests that, without bias, a sufficiently high internal field can be expected when the doping concentration is very high. For example, when $N=4\times10^{18}/cm^3$ and d=300 Å, the resulting maximum field is as high as $9\times10^5$ V/cm at zero bias. Such doping superlattices are useful as photodetectors, because there is no dark current across the layers as described later. However, high doping makes a close compensation between p- and n-layers very difficult, and, moreover, deteriorates the crystal quality by creating undesirable defect centers. At moderate doping levels ($1\times10^{17}$ to $1\times10^{18}/cm^3$), higher internal field may be achieved with the layer structure above the dashed line, where the application of reverse bias is required for complete depletion.

In the presence of the tilting field F, the total electric field can be expressed by $$F(x) = \sqrt{F_o(x)^2 + F_t^2} \tag{C}$$

The dark current in a semiconductor device of the presently described kind may be composed of the following three components: tunnelling current across the layer, tunnelling current at the junctions between the selective electrodes and the device, and the surface leakage current. Among these the first component is very important, and appears in the doping superlattices in which $V_M > E_{fn} - E_{fp}$. The doping superlattices in this category require reverse bias application for complete depletion. The reverse bias voltage, however, causes leakage current due to the electron tunnelling across the high field region of the layers. When the superlattice is composed of m+1 layers of n-type and m layers of p-type material, and has an active area of $1\times1'$cm$^2$, the total tunnelling current $I_t$ is given by $$I_t = 2 \, m \, l \, l' J_t \tag{D}$$

where $J_t$, is the tunnelling current density across the doping superlattice layers, and can be estimated according to the expression given by E. O. Kaye in the Journal of Applied Physics, vol. 32, 83 (1961) by ignoring the possible two dimensional subband systems in the layers. The solid curves in FIG. 7 show equi-tunnelling current density lines thus calculated. If we assume the maximum permissible leakage current to be 100 nA, $J_t$ should be less than $25\times10^{-5}$ A/cm$^2$ for the devices with an active area of $10^{-4}$cm$^2$ ($1=1'=100$ μm) and m=10. In this case, $F_M$ can be higher than $4.5\times10^5$ V/cm even when the doping concentration is as low as $1\times10^{17}$/cm$^2$.

The other two components of dark current; the tunnelling current at the junctions between the selective electrodes and the device and the surface leakage current can be reduced by improving the structure symmetry and by using a proper surface coating, respectively.

Figure 8:
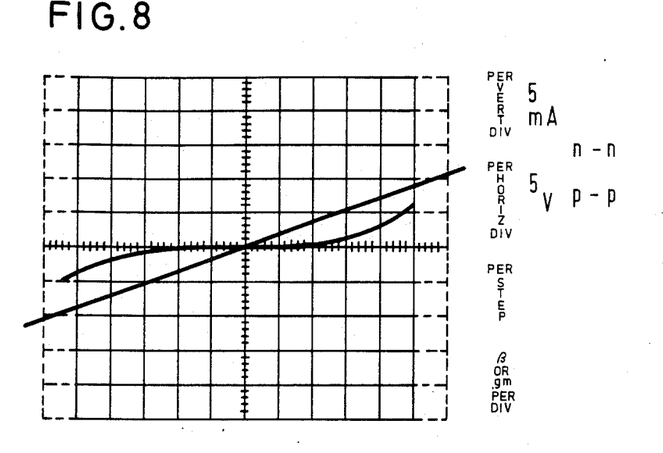

As described before, an exact symmetry of the structure is much more desirable. However, the exact compensation between n- and p-layers, therefore, the complete depletion of both n- and p-layers is very difficult. The imbalance between the product values in the n-type and p-type material ($N_d d_n$ and $N_a.dp$) can be evaluated by measuring the resistivity of the layers through n—n or p—p selective contacts. An example of V-I traces are shown in FIG. 8 for a doping superlattice with doping concentration and layer thickness nominally equal to $1\times10^{18}$/cm$^3$ and 500 Å, respectively. According to FIG. 7, all the layers in this structure should be completely depleted before biasing. However, because of the imbalance, this superlattice exhibits n-type conductivity instead of being semi-insulating. The resistivity of the p-layers is very high at low biases showing the complete depletion of the p-layers. Non-linear current increase at higher bias voltages is due to the breakdown between the neighbouring low-resistive n-layers.

Figures 9A, 9B:
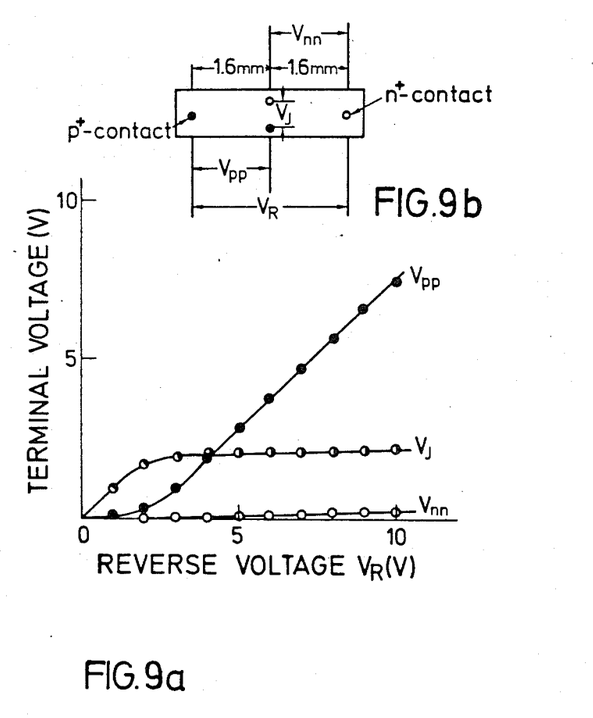

FIG. 9a shows experimental characteristics of a $V_M > E_{fn} - E_{fp}$ doping superlattice detector with a small imbalance ($N_d \cdot d_n > N_a \cdot d_p$). The device shape and contact configuration are depicted in FIG. 9b. With increasing reverse bias ($V_R$) the space charge potential, and therefore the p-n junction voltage ($V_J$) first increases until the voltage reaches $V_{th}$ which causes the complete depletion for p-layers. Further increase in $V_R$ results in no further increase of the space charge potential, which leads to a constant $V_J (= V_{th})$. Because of the residual free electrons in the n-layers, the incremental voltage is mainly applied to the p+ (contact) -n (superlattice) junction. The residual free carrier concentration is not easily reduced, because very close compensation requires precise balance between four quantities; $N_d, N_a, d_n$, and $d_p$. Nevertheless, it has been possible using normal MBE equipment to obtain very closely compensated samples. For example, in a sample with a nominal doping concentration of $1 \times 10^{18}/cm^3$, the residual carrier concentration averaged by all the layers was as low as $5 \times 10^{15}/cm^3$.

The photoresponse spectrum of devices similar to that described in connection with FIG. 1 was measured under the application of various biases. The devices were irradiated by a chopped monochromatic light from a grating monochrometer-tungsten lamp combination, and the photocurrent was measured by a lock-in amplifier.

Figure 10A:
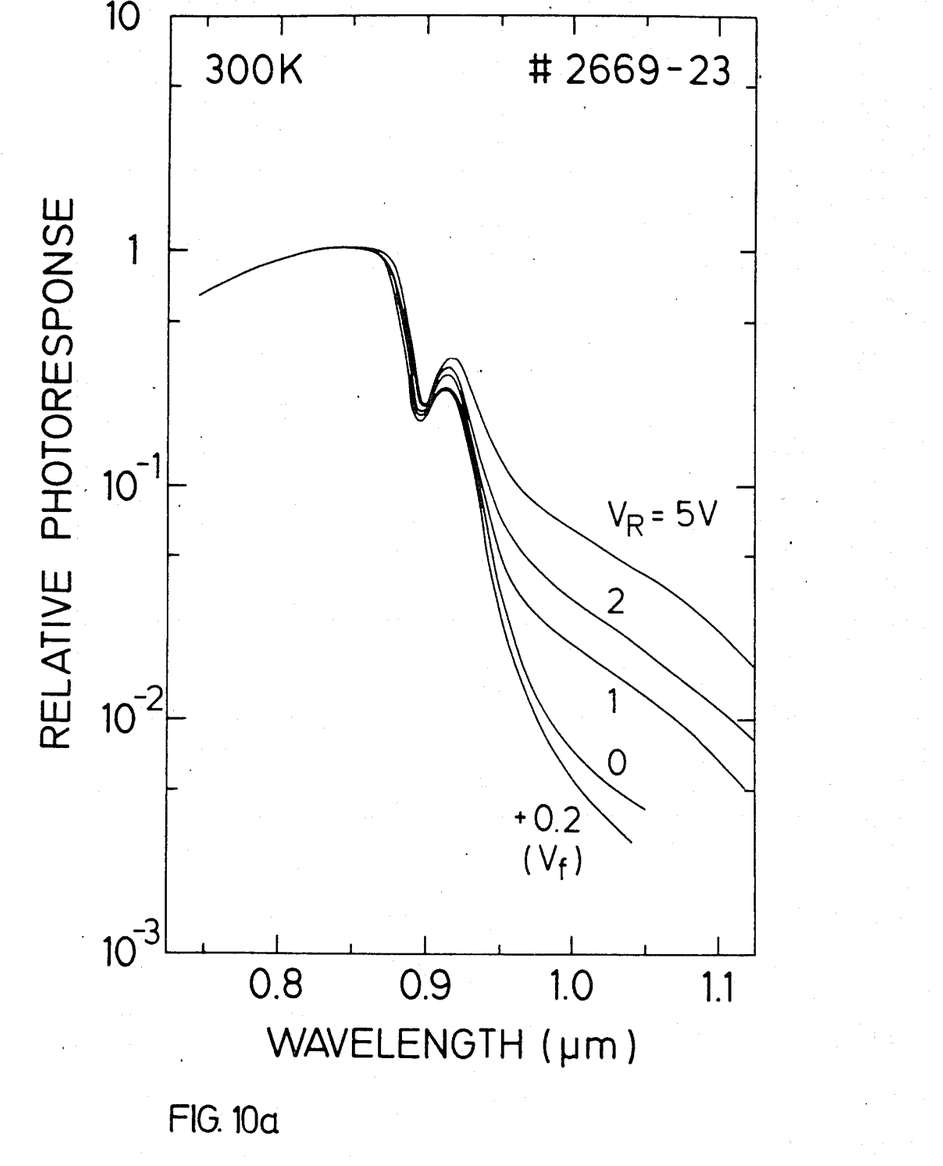
Figure 10B:
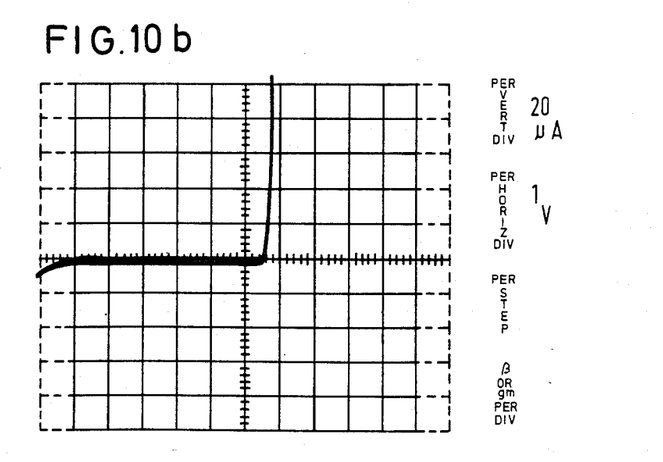

The following discussion first concerns the characteristics of those devices in which $V_M > E_{fn} - E_{fp}$; that is, devices composed of non-depleted layers at zero bias. FIG. 10a demonstrates the applied bias dependence of the spectral response for a device, where $N = 5 \times 10^{17}/cm^3$, $d = 1080$ Å and $m = 10$. In this structure, $V_{th}$, the voltage required for the complete depletion, is about 0.75V. Up to this voltage, internal electric field increases due to the space charge increase. A relatively large enhancement of 0.9-1.1 μm wavelength range sensitivity at 1V reverse bias may reflect the internal field increase due mainly to this mechanism. The dark current is negligibly small as shown in FIG. 10a because of a negligible contribution of tunnelling (see FIG. 7).

However, this doping superlattice is not exactly symmetric, but exhibits relatively high n-type conductivity regardless of bias. Therefore, an increased reverse bias beyond 0.75V will be applied to the p+- n junction near the p-type selective electrode. This means that the application of only a few volts results in a considerably higher electric field perpendicular to the superlattice periodicity, and enhances the long wavelength sensitivity as shown in the figure. However, no further biases exceeding 5V can be applied to this device, because, as shown in the inset, this device suffers from a leakage current above this voltage, probably due to the tunnelling current across the p+- n junction. The spectra shown in FIG. 10a have an additional peak at 0.93 μm. This structure may be associated with the doped donor or acceptor impurities, because it is much more pronounced when the asymmetry of the structure is fairly large.

The characteristics of devices where $V_M > E_{fn} - E_{fp}$ will now be discussed.

Figure 11:
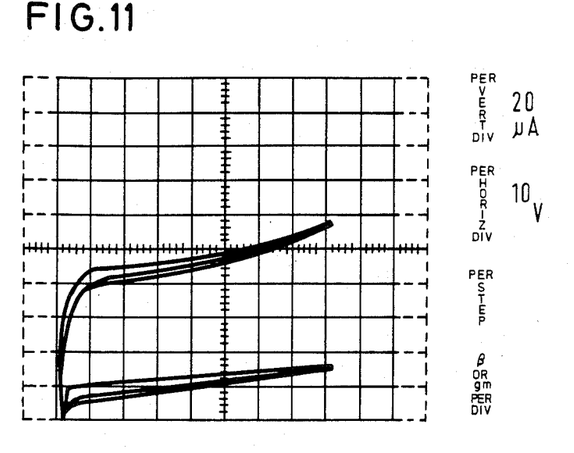
FIG. 11 reverse I - V traces with (a) and without (b) irradiation for a first GaAs sample device, FIG. 12 reverse I - V traces with (a) and without (b) irradiation for a second GaAs sample device, FIG. 13 the spectral response of the device of FIG. 11 at various reverse biases, FIG. 14 the spectral response of the device of FIG. 12 at various reverse biases.
Figure 12:
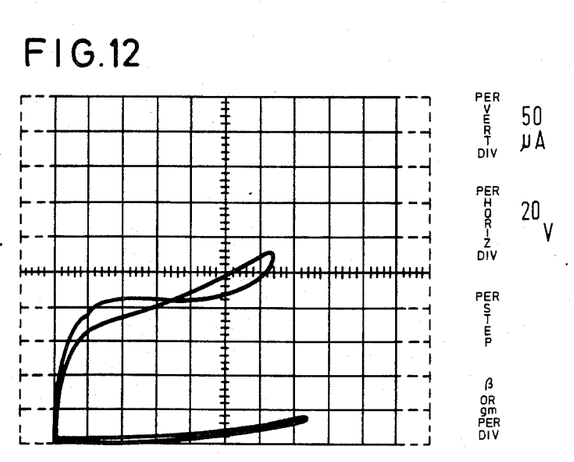
Figure 13:
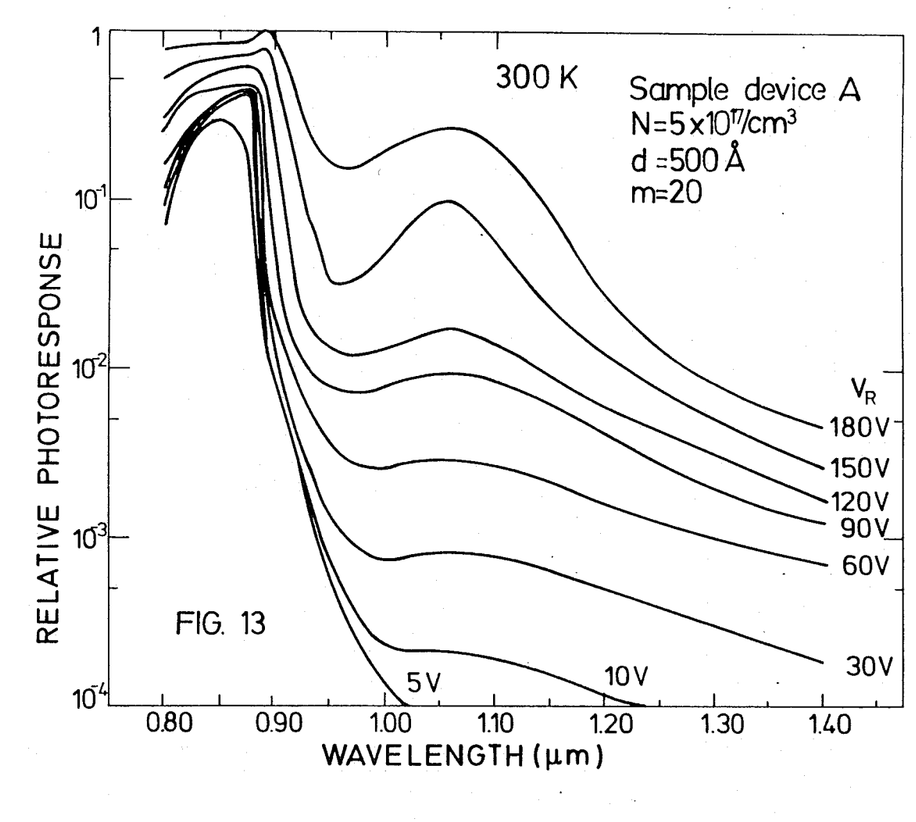
Figure 14:
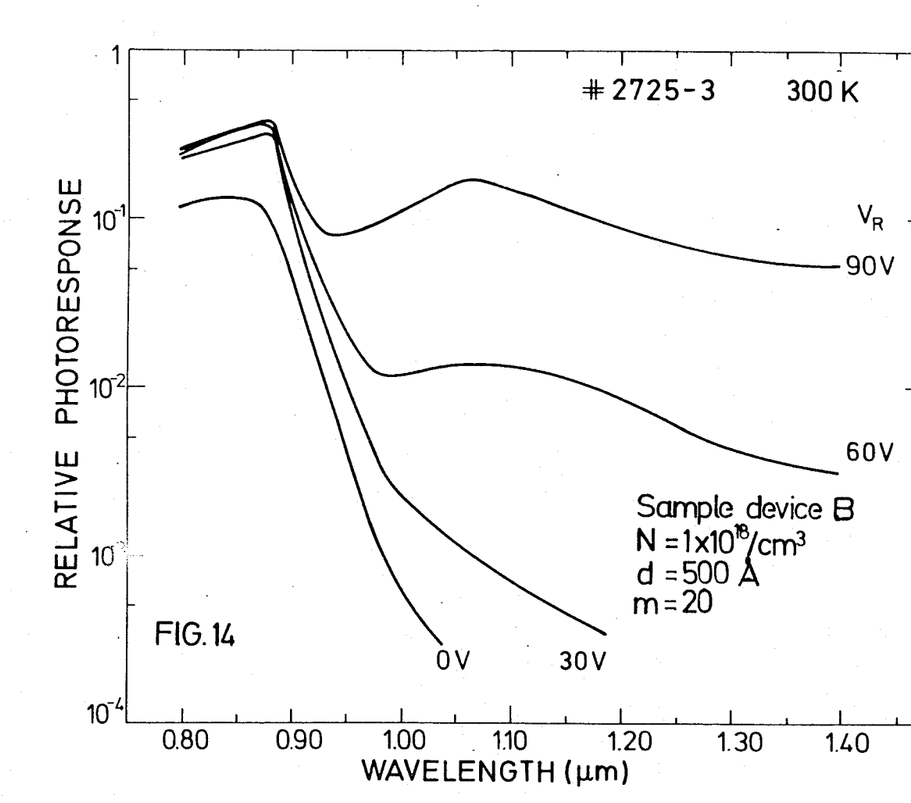

FIGS. 11 and 12 show the reverse I-V traces with and without irradiation for two sample devices A and B having nominal structure parameters of $N = 5 \times 10^{17}/cm^3$, $d = 500$ Å, $m = 20$ and $N = 1 \times 10^{18}/cm^3$, $d = 500$ Å, $m = 20$, respectively. Although these devices do not show breakdown up to 200V, the dark current is not very low. Since no tunnelling current is expected across the layers (see FIG. 7), this dark current is probably caused by the surface leakage current. Indeed, the dark current was reduced by a factor 2 when the diode was rinsed in a diluted HCl solution. Because $V_M < E_{fn} - E_{fp}$, internal space charge modulation should be constant regardless of the bias voltages. The maximum space charge field can easily be read from FIG. 7 to be $1.8 \times 10^5$V/cm and $3.6 \times 10^5$V/cm respectively. Although the layer structures of these devices were not exactly symmetric, the residual free carrier densities averaged over the layers were extremely small ($2-5 \times 10^{15}/cm^3$). Therefore, the applied voltage increased the electric field over a fairly wide area near the contact region and enhanced the long wavelength sensitivity in this region. FIGS. 13 and 14 show the spectral sensitivity for these devices at various bias voltages.

For the sample device A the depletion width near the contact region was about 10 μm and the tilting field strength is $4 \times 10^5$V/cm at 180V reverse bias. For sample device B the depletion width and the maximum tilting field are about 6 μm and $3.2 \times 10^5$V/cm, respectively, at 90 V reverse bias. Therefore, the total electric field given by Equation C in these devices is fairly high. Indeed, as shown in FIGS. 13 and 14, the longer wavelength sensitivity is considerably enhanced at high reverse biases. Note that, for sample device B, the sensitivity at 1.3 μm wavelength reaches more than 20% of the band edge response at 0.85 μm at 90V bias. Moreover, the sensitivity could be further increased by increasing the total superlattice thickness. The difference in the longer wavelength sensitivity between sample devices A and B at the same bias voltage (for example 90V) may be attributed to the difference in the periodic space charge field, because the tilting field strengths caused by the externally applied bias should be very similar with each other.

However, except for the spectra measured at zero or very low reverse biases, the long wavelength sensitivities are very much higher than might be expected by applying the weak field theory to the presently proposed devices. This may be due to the fact that the theory deals with very pure and highly resistive materials where no band tail states are expected, because, otherwise, high electric field cannot be applied to the sample. In the present doping superlattice detectors, the constituent layers are highly doped, and, therefore, considerable band tail states can be found in the forbidden gap region. This results in a greater probability of finding electrons or holes inside the energy gap, and enhances the long wavelength sensitivity when a strong electric field is present. The structure around 1.1 μm wavelength in the spectra measured at higher bias voltages may evidence the existence of a notably high density of states inside the energy gap.

The above described experimental results all relate to a doping superlattice in which the parent material is gallium arsenide.

Similar results can be obtained with other materials, with silicon and indium gallium arsenide being of particular interest. The conventional dopants for these materials can be used to produce the n-type and p-type layers.

The semiconductor devices described herein are believed particularly suitable for use in optical fiber communication systems where the wavelenth of interest lie in the range 0.8 to 0.9 μm where ALGaAs lasers and LEDs have their emission lines. Future operating wavelengths may shift to the 1.1 to 1.6 μm spectral region where optical fibers have lower optical loss and minimum material dispersion. Semiconductor devices in accordance with the present teaching should have ideal characteristics in this spectral region and a sufficient bandwidth or speed of response to accommodate high information rates.

Furthermore, semiconductor devices in accordance with the present teaching are essentially low noise devices or devices which can operate with a high signal to noise ratio which again makes them well suited to use as detectors in optical communication systems.

Finally, it should be pointed out that the characteristic of FIG. 10a or FIGS. 13 and 14 means that the associated devices can be used to analyse the wavelength of detected radiation by scanning the reverse bias across a range of values and mathematically analysing the resultant photocurrents.

We claim:

1. A semiconductor detector for electromagnetic radiation or particles, the detector comprising a semi-insulating substrate, a first layer deposited thereon and having one of n-type and p-type conductivity, a plurality of layers of alternating p and n conductivity types deposited in series on said first layer and terminating in an outermost layer, a strongly p-type electrode region which extends through said p-type and n-type layers and defines a first selective electrode, and a strongly n-type electrode region which also extends through said p-type and n-type layers, and which is spaced apart from said strongly p-type region and defines a second selective electrode with said electrodes for imparting a reverse bias voltage across said layers; wherein said detector is a homogenous semiconductor, characterized by a bulk semiconductor band gap energy and having real space energy bands and having space charge induced periodic modulating of said energy bands leading to confinement of electrons and holes in alternate layers, wherein the n-type and p-type layers other than said first layer and said outermost layer have substantially identical thickness and doping concentrations; wherein said thickness of said n-type and p-type layers other than said first layer and said outermost layer is nominally equal to 500 Å or less; wherein said first layer and said outermost layer are of the same conductivity type and have a thickness substantially equal to one half of the thickness of each of the other layers; wherein said first layer and said outermost layer have a doping concentration of the other layers; wherein the variation in the value of the product for each layer, other than said first layer and said outermost layer, of the respective doping concentration times the respective layer thickness does not exceed 0.5%; wherein the total number of layers of alternating conductivity types is an odd number; and wherein the doping concentrations are such that said concentrations are substantially depleted at zero reverse bias; whereby a high reverse bias can be applied to the device thereby tilting the real spaced energy bands of the layers by the resulting electric field to facilitate the detection of radiation having energy less than the bandgap energy of the bulk semiconductor.

2. A semiconductor detector in accordance with claim 1, wherein said odd number lies between 9 and 51, with said total number of layers having a minimum total thickness of 1 micron.

3. A semiconductor detector in accordance with claim 1, wherein the n-type and p-type layers are gallium arsenide with suitable dopants; and wherein cladding layers, comprising the first layer and the outermost layer, are of n-type conductivity.

4. A semiconductor detector in accordance with claim 1, characterized in that the n-type and p-type layers are silicon with suitable dopants.

5. A semiconductor detector in accordance with claim 1, characterized in that the n- and p-type layers are indium gallium arsenide.

6. A semiconductor detector in accordance with claim 1, wherein layers of intrinsic material are provided between the alternate layers of different conductivity types, but not outside of said first layer and said outermost layer.

7. A semiconductor detector in accordance with claim 6, wherein the intrinsic material has a thickness of the order of magnitude of 100 Å.

8. A semiconductor device in accordance with claim 1, wherein said semi-insulating substrate is of the same material as said p- and n-type layers.

* * * * *